United States Patent [19]
Olney, Jr. et al.

[11] 3,711,924
[45] Jan. 23, 1973

[54] GRAVITY-FED PIN INSERTION DEVICE

[75] Inventors: Frederick D. Olney, Jr., Phoenix; Robert O. Crump, Scottsdale, both of Ariz.

[73] Assignee: Honeywell Information Systems Inc., Waltham, Mass.

[22] Filed: March 11, 1971

[21] Appl. No.: 123,361

[52] U.S. Cl. ............................29/203 B, 29/DIG. 46
[51] Int. Cl. ............................................H05k 13/04
[58] Field of Search..29/203 B, 203 R, 203 D, 203 P, 29/DIG. 46

[56] References Cited

UNITED STATES PATENTS

| | | | |
|---|---|---|---|
| 3,307,253 | 3/1967 | Wullenwaber | 29/211 C |
| 3,375,573 | 4/1968 | Simon | 29/203 R |
| 3,501,825 | 3/1970 | Alexander et al | 29/203 R |

*Primary Examiner*—Thomas H. Eager
*Attorney*—Fred Jacob and Edward W. Hughes

[57] ABSTRACT

A pin insertion device which uses gravity to feed straight pins into a hopper employs a plurality of partitions to align the pins with a plurality of ports in one wall of the hopper. The pins are held in alignment by the ports and by a groove in a pusher while the pusher moves the pins through the ports for insertion into holes in a circuit board which is positioned near the ports.

9 Claims, 6 Drawing Figures

INVENTORS
FREDERICK D. OLNEY JR.
ROBERT O. CRUMP
BY
Floyd B. Guernsey
AGENT

INVENTORS
FREDERICK D. OLNEY JR.
ROBERT O. CRUMP
BY
Lloyd B. Guernsey
AGENT

GRAVITY-FED PIN INSERTION DEVICE

BACKGROUND OF THE INVENTION

The present invention pertains to a pin insertion device and more particularly to a device which uses gravity to feed a plurality of straight pins into alignment with a plurality of ports in a hopper. A pusher then moves the pins through the ports and forces the pins into a board positioned adjacent the hopper.

Modern electronic equipment such as high speed data processing systems use microcircuits to reduce the physical size of the system and to increase the operating speed and reliability. These microcircuits are built in modules each of which may replace a large number of circuits using discrete circuit components. A plurality of these modules may be mounted on a circuit board and a plurality of these circuit boards mounted in a cabinet. It is often necessary to make electrical connections between modules which are mounted on a given circuit board and to connect modules on one board with modules on another board. One of the most reliable methods of connecting modules on one board with modules on another board is to insert connector pins into the circuit board and to wrap one end of a connecting wire around a pin and solder the other end of the wire to a connection on a circuit module. Other wires or cables may then be used to connect pins on one circuit board with pins on other circuit boards.

The complexity of the circuits used in data processing systems may require that hundreds of connector pins be used on each of the circuit boards. These pins may be forced by high pressure into the circuit boards at right angles to the surface of the boards. There have been many attempts to develop devices or machines which will rapidly and accurately place these pins at the desired positions on the circuit boards. Some prior art machines use a plurality of pins inserted in a belt which moves past an insertion head. The belts are bulky, inconvenient and expensive. These prior art machines insert only one pin at a time into the board so that a relatively long time duration is required to insert the hundreds of pins needed in some circuit boards.

The present invention alleviates some of the disadvantages of the prior art machine by disclosing a pin insertion device which uses loose pins rather than pins mounted in a belt. The present invention can also insert a plurality of pins simultaneously into the circuit board or it can be used to insert a single pin into the board.

It is, therefore, an object of this invention to provide an improved device for inserting pins into a board.

Another object of this invention is to provide an improved device for simultaneously inserting a plurality of pins into a board.

A further object of this invention is to provide a device which uses gravity to feed pins into alignment for insertion into a board.

Still another object of this invention is to provide an improved device for simultaneously inserting a plurality of straight pins into a board.

Another object of this invention is to provide a device which uses gravity tc feed a plurality of straight pins into a desired alignment and then simultaneously inserts a plurality of pins into a board.

SUMMARY OF THE INVENTION

The foregoing objects are achieved in the instant invention by providing a new and improved pin insertion device which uses loose, straight pins. These loose pins are fed by gravity into a hopper which has a plurality of partitions. Here the pins are aligned by the partitions. The aligned pins are forced through a plurality of ports in one wall of the hopper into a board which is positioned adjacent the ports.

Other objects and advantages of this invention will become apparent from the following description when taken in connection with the accompanying drawings.

DESCRIPTION OF THE PREFERRED EMBODIMENT

Figure 1:
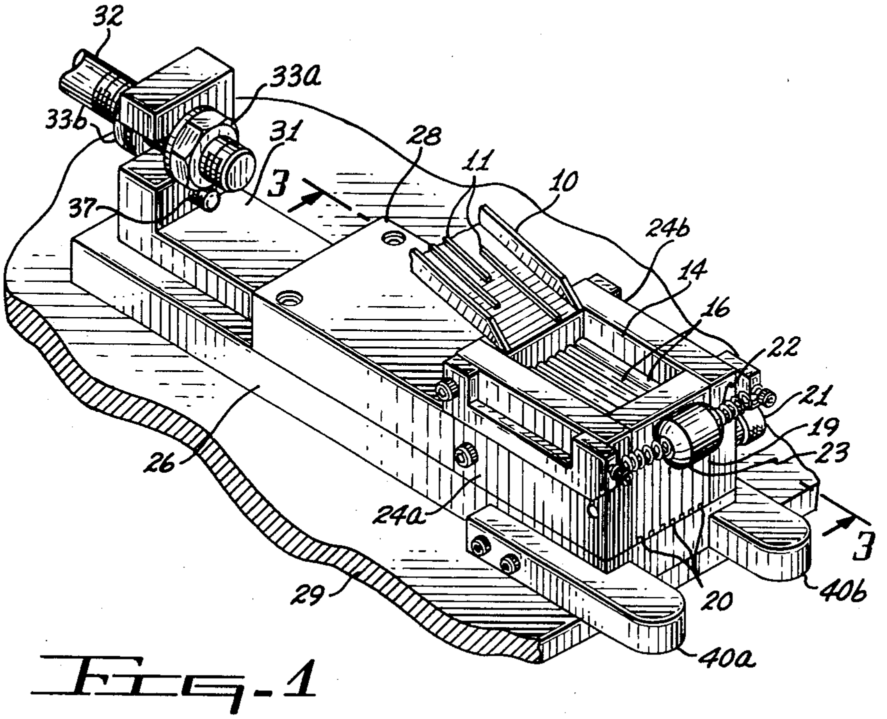
FIG. 1 is a perspective view of a gravity-fed pin insertion device embodying the instant invention.

Referring now to FIG. 1 there is shown a device for inserting a plurality of pins in the board comprising a vibrating trough 10 which supplies a plurality of straight pins 11 to a hopper 14. The pins 11 are dropped into the hopper and are aligned by the plurality of partitions or spacer blades 16 into the spaces 17 between the blades. The pins are each aligned so that one end of each pin is adjacent the forward wall 19 which has a plurality of holes or ports 20 at the bottom of the hopper 14. The front wall 19 is pivotedly mounted by the pivot rod 21 to the side walls 24*a* and 24*b*. A spring 22 causes a roller 23 to be pressed against the top face of the front wall 19 so that the upper portion of the wall 19 is moved slightly toward the left as shown in FIG. 1.

Figure 2:
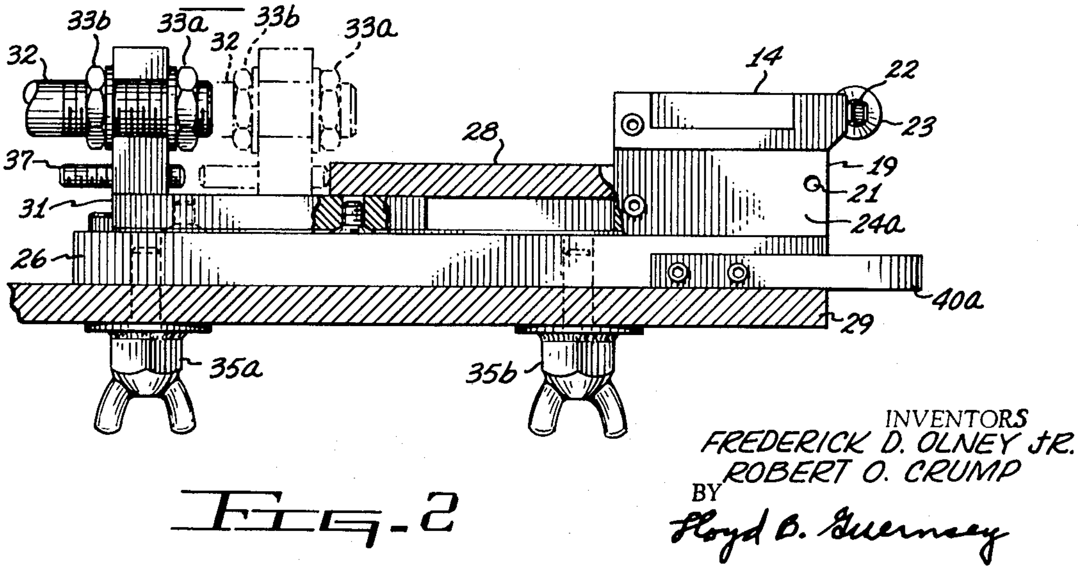
FIG. 2 is a side view illustrating a pin insertion device of the present invention.

The bottom plate 26 which is also the bottom of the hopper 14 is mounted on the base plate 29. A pusher 31 is movable mounted inside the stop plate 28. The pusher is moved by power supplied from the push rod 33 which is connected to the pusher 31 by a pair of nuts 33*a* and 33*b* as shown in FIGS. 1 and 2. The hopper and the bottom plate 26 are secured to the base plate 29 by a pair of wing bolts 35*a* and 35*b* as shown in FIG. 2. The stop plate 28 and the stop bolt 37 limit the distance of travel of the pusher 31. A pair of guides 40*a* and 40*b* may be used as an aid in positioning boards near the hopper so they will be in the correct position for receiving the pins.

Figures 3, 4:
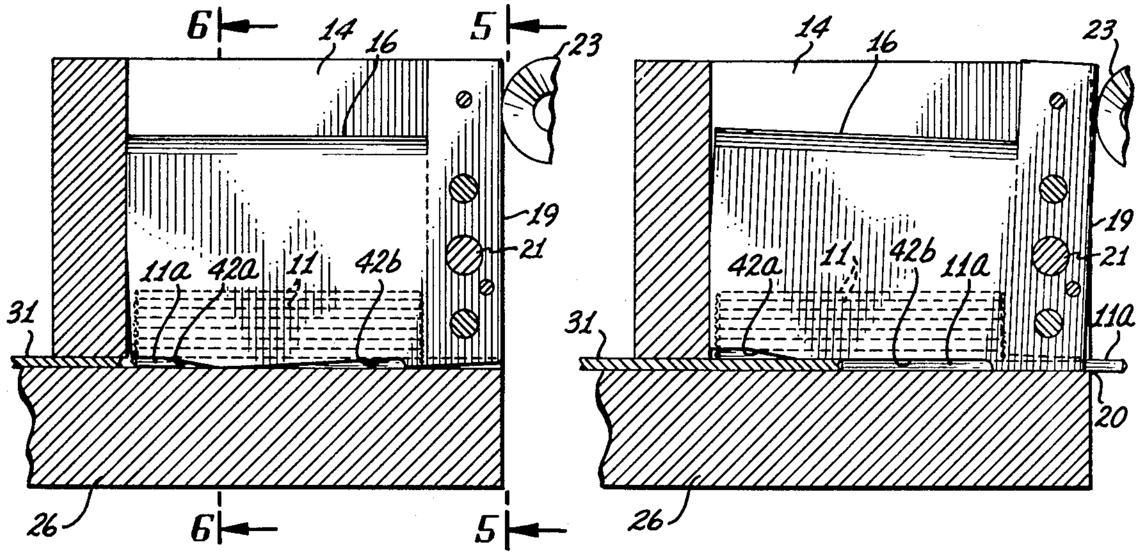
FIGS. 3 and 4 are cross-sectional views of the portion of the hopper of the present invention.

Details of the hopper 14 and the method of mounting the spacer blades can be more clearly seen by referring to FIGS. 3–6. The position of the spacer blades 16, the spaces 17 between blades, the sidewalls 24*a* and 24*b* and the bottom plate 26 can be more clearly seen by referring to FIG. 6. The distance between the blades 16 is slightly greater than the width of the pins being used but is substantially less than twice the width of the pins so that a single pin lies on the bottom plate 26 in each space 17 and other pins are then stacked in a horizontal position on top of each of the bottom pins. The pins which are dropped into the hopper will be positioned in the spaces 17 and aligned so that each pin has one end adjacent the forward wall 19 as shown in FIGS. 3 and 4. Each of the bottom pins 11a shown in FIG. 3 has one end adjacent one of the ports 20 and the other end adjacent pusher 31.

In FIG. 3 the pusher 31 is positioned to the left of the figure so that the spacer blade 16 rests with bottom edge of the spacer blade on the bottom plate 26. When the pusher is moved toward the right the edge of the pusher 31 makes contact with the beveled lower edge 42*a* of the spacer blade 16 causing the left end of the spacer blade to move upward and the entire spacer blade 16 to pivot slightly clockwise about the pivot rod 21. When the edge of the pusher 31 moves to the right past the beveled lower edge 42*a* of the spacer blade the spacer blade 16 pivots into the position shown in FIG. 4. At the same time the bottom pin 11a has started to move through the port 20 so that a portion of the pin 11a is now to the right of the forward wall 19 and is protruding through the port. As the pusher 31 continues toward the right the pin 11a is forced into a board (not shown) which would be positioned to the right of the hopper shown in FIG. 4. At this same time other pins which are resting on the bottom plate 26 are moved through the plurality of ports 20 shown in FIG. 5.

The spacer blades 16 keep the lower pins 11*a* in correct horizontal alignment with the ports 20. The ports and the groove in the edge of pusher 31 keep the pins in correct vertical alignment with the ports. The ends of the pins may be slightly pointed to facilitate their insertion into boards. The groove in the edge of the pusher is designed to mate with the end of the pin and to prevent the left end of the pins (FIGS. 3 and 4) from moving upward as the pusher moves the bottom pins through the ports.

When the pusher 31 has moved all the way to the right so that pin 11a has been forced into the board, the board can be removed and the pusher then moved back to the left into the position shown in FIG. 3. At this time other pins will drop into position on the bottom plate 26 so that the next time that pusher 31 moves to the right another seven pins will be moved out through the ports 20 into a board to the right of FIG. 4.

Figures 5, 6:
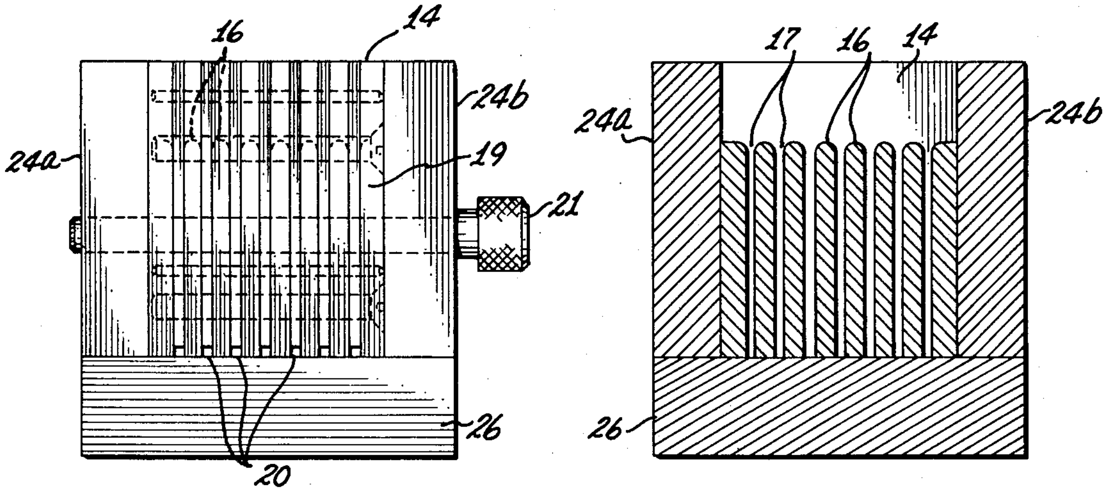
FIG. 5 is an end view of the hopper illustrating the present invention.
FIG. 6 is a cross-sectional view of the hopper of the present invention.

It should be understood that while the drawing in FIG. 5 shows seven ports, so that seven pins could be inserted simultaneously into a board, fewer than seven pins could be inserted into the board by selectively placing a barrier across some of the spaces 17 so that pins do not fall into these spaces. It is also possible to provide a pin insertion device having more or less than seven ports and spaces between spacer blades so that any reasonable number of pins may be inserted simultaneously.

When it is desired to insert pins further into a board than can be done with the device shown in FIG. 1 the guides 40*a* and 40*b*, the spring 22 and the roller 23 may be removed. The board can then be placed directly against the forward wall 19 of the hopper while the pins are inserted into the board. The weight of the spacer blades 16 causes the bottom edge of each blade to rest on the bottom of hopper 14 or on pusher 31 and keep the pins in correct alignment. However, the removal of spring 22 and roller 23 cause the operating speed of the device to be reduced. When the spring and roller are used the blades return more rapidly to rest against the bottom of the hopper when the pusher 31 is returned to the position shown in FIG. 3. Friction between the rapidly moving blades and the pins also causes the pins to move down more rapidly than when gravity alone is used to move the blades so that higher speed operation is possible.

The pin insertion device shown can also be used to load a plurality of pins into a magazine to be used in pin insertion machines of various types. The device can also be used to load pins into an insertion head which then inserts the pins into circuit boards.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. A pin insertion device comprising:

a hopper having a forward wall with a plurality of ports at the base of said wall for the passage of pins therethrough;

a plurality of spaced parallel partitions mounted in said hopper, said partitions being positioned so that the distance between adjacent partitions is slightly greater than the width of a pin but considerably less than twice the width of said pin, said partitions being positioned so that each pin lying on the bottom of said hopper has a first end adjacent a corresponding one of said ports; and a pusher, said pusher being positioned adjacent a second end of each pin lying on the bottom of said hopper, said pusher being movable toward said wall to move each of said pins on said bottom through a corresponding one of said ports.

2. A pin insertion device as defined in claim 1 wherein:

said pusher has a groove in one edge thereof, said groove being adapted to mate with the end of each of said pins, said groove and each one of said ports holding a corresponding one of said pins in alignment with said port while said pins are being moved through said ports.

3. A pin insertion device as defined in claim 1 including:

a source of pins comprising a vibrating trough, said source being positioned above said hopper, and dropping pins into said hopper.

4. A pin insertion device comprising:

a hopper having a forward wall with a plurality of ports at the base of said wall for the passage of pins therethrough;

a plurality of spaced partitions pivotedly connected to said hopper, said partitions being connected substantially at right angles to said wall, said partitions being mounted in said hopper, said partitions being positioned so that the distance between adjacent partitions is slightly greater than the width of a pin, but considerably less than twice the width of said pin, said partitions being positioned so that each pin lying on the bottom of said hopper has a first end adjacent a corresponding one of said ports; and a pusher, said pusher being positioned adjacent a second end of each pin lying on the bottom of said hopper, said pusher being movable toward said wall to move each of said pins lying on said bottom through a corresponding one of said ports.

5. A pin insertion device as defined in claim 4 wherein the bottom edge of each of said partitions is formed so that a portion of said edge rests on the bottom of said hopper when said pusher is positioned away from said forward wall, said pusher sliding between said bottom of said hopper and said bottom edge of said partition as said pusher moves toward said forward wall.

6. A pin insertion device as defined in claim 4 wherein the bottom edge of each of said partitions is formed so that a portion of said edge rests on the bottom of said hopper when said pusher is positioned away from said forward wall, said pusher sliding between said bottom of said hopper and said bottom edge of said partition as said pusher moves toward said forward wall; said device including:

spring means for biasing said bottom edge of said partitions toward the bottom of said hopper.

7. A pin insertion device comprising:

a hopper having a forward wall with a plurality of ports at the base of said wall for the passage of pins therethrough;

a source of pins, said source being positioned above said hopper, said source dropping pins into said hopper;

a plurality of spaced parallel partitions mounted in said hopper substantially at right angles to the surface of said wall, said partitions being positioned so that the distance between adjacent partitions is slightly greater than the width of a pin but considerably less than twice the width of said pin, said partitions being positioned so that each pin lying in the bottom of said hopper has a first end adjacent a corresponding one of said ports;

a pusher, said pusher being positioned adjacent a second end of each pin lying on the bottom of said hopper, said pusher being movable toward said wall to move each of said pins on said bottom through a corresponding one of said ports; and means connected to said pusher for selectively moving said pusher toward said forward wall and moving said pusher away from said forward wall.

8. A pin insertion device as defined in claim 7 wherein the bottom edge of each of said partitions is formed so that a portion of said edge rests on the bottom of said hopper when said pusher is positioned away from said forward wall, said pusher moving between said bottom of said hopper and said bottom edge of said partitions as said pusher moves toward said forward wall.

9. A pin insertion device as defined in claim 8 including:

spring means for biasing said bottom edge of said partitions toward the bottom of said hopper.

* * * * *